US005204631A

United States Patent [19]

Hobbs

[11] Patent Number: 5,204,631

[45] Date of Patent: Apr. 20, 1993

[54] SYSTEM AND METHOD FOR AUTOMATIC THRESHOLDING OF SIGNALS IN THE PRESENCE OF GAUSSIAN NOISE

[75] Inventor: Philip C. D. Hobbs, Briarcliff Manor, N.Y.

[73] Assignee: International Business Machines Corporation, Armonk, N.Y.

[21] Appl. No.: 703,072

[22] Filed: May 20, 1991

[51] Int. Cl.[5] .......................... H03B 1/00; H03B 1/04

[52] U.S. Cl. .......................... 328/165; 328/162; 307/359; 307/521

[58] Field of Search .............. 307/520, 521, 356, 359, 307/360; 328/165, 167, 162, 168

[56] References Cited

U.S. PATENT DOCUMENTS

| | | | |
|---|---|---|---|
| 3,737,790 | 6/1973 | Brown | 307/359 |
| 3,961,274 | 6/1976 | Jones et al. | 328/165 |
| 4,036,057 | 7/1977 | Morais | 73/88 R |
| 4,162,454 | 7/1979 | Olsen | 307/359 |
| 4,571,547 | 2/1986 | Day | 307/359 |
| 4,908,623 | 3/1990 | Ullestad | 341/167 |
| 4,908,875 | 3/1990 | Assael et al. | 382/52 |
| 4,929,851 | 5/1990 | Pace | 307/359 |

FOREIGN PATENT DOCUMENTS

| | | |
|---|---|---|
| 56-164951 | 12/1981 | Japan . |
| 62-38613 | 2/1987 | Japan . |
| 63-16707 | 1/1988 | Japan . |
| 2-24520 | 1/1990 | Japan . |

*Primary Examiner*—Timothy P. Callahan

*Attorney, Agent, or Firm*—Sterne, Kessler, Goldstein & Fox

[57] ABSTRACT

A system and method for detecting information signals by automatically thresholding input signals in the presence of noise of accurately known statistics concerning a predetermined acceptable false alarm rate data. A first subcircuit including a comparator and a servo amplifier is used for setting and adjusting a threshold value signal based on the input signal and the statistics concerning a predetermined acceptable false alarm rate. A second comparator is used for comparing the threshold value signal to the input signal, and outputting a signal corresponding to the difference therebetween.

10 Claims, 2 Drawing Sheets

SYSTEM AND METHOD FOR AUTOMATIC THRESHOLDING OF SIGNALS IN THE PRESENCE OF GAUSSIAN NOISE

TECHNICAL FIELD

The field of the invention relates generally to signal detection in the presence of noise. More specifically, the present invention concerns a system and method for estimating the noise amplitude in the presence of signals, and automatic thresholding of signals in the presence of gaussian noise.

BACKGROUND ART

Many types of detection problems involve small signals in the presence of noise. The statistics of the noise are often (though not always) Gaussian.

The automatic system and method for thresholding signals in the presence of gaussian noise (hereafter referred to as the "present invention") may be used for threshold detection in a particle detection tool for vacuum process chambers, for example. The present invention is generally applicable in optical detection of particles, because all current detectors raise their threshold voltage by several decibels above the theoretical value for a given false alarm rate to avoid large increases in their false alarm rates due to signal- and noise-level changes, and thus sacrifice a great deal of sensitivity. This lost sensitivity is costly, since increasing laser power to compensate for it is very expensive and the minimum detectable particle size goes up as the sensitivity goes down. As semiconductor feature sizes shrink, smaller and smaller particles can give rise to killer defects. It is important to continue to reduce the lower detection limit for particle size.

The present invention lends itself to a plethora of other applications as well. The present invention can be used to solve problems involving the counting of threshold-crossings in the presence of noise or the estimation of noise levels, where the probability distribution function of the noise and the bandwidth are known a priori. Some examples include optical communications, ultrasonic ranging, gravity wave detectors, seismometers, and many types of optical measurements, and so on.

Typically, in particle detection systems, an event is detected when the signal voltage crosses a preset threshold voltage. The false alarm rate (FAR), i.e., the rate at which threshold crossings due to noise peaks occur, depends only on the detection noise bandwidth, the ratio $\gamma$ (gamma) of the threshold voltage $V_t$ to the RMS noise voltage $V_n$, and the amplitude statistics of the noise. Since for Gaussian noise (as well as several other types) this relationship is a very steep and monotonic one, it is possible in principle to set the threshold so that the FAR is as small as desired.

The problem with this scenario is that the desired FAR may be only one count per hour, day, or year, making verification difficult due to the extremely long counting times required to get decent count statistics. In addition, the true count rate (i.e., counts due to actual events of the type trying to be measured) is generally considerably higher than the false count rate, so that the false counts cannot be counted independently in general.

If the false count rate were a slowly varying function of the threshold, this would not be much of a problem; small shifts in gain, signal power, or threshold voltage would not cause large false alarm rate changes. It turns out that for many types of noise, especially exponential and Gaussian, the FAR is an extremely sensitive function of the threshold voltage. For a single pole rolloff with noise bandwidth B, in pure Gaussian noise, the false alarm rate is given by:

$$FAR(\gamma) = \left(\frac{B}{\sqrt{3}}\right)e^{\left(-\frac{\gamma^2}{2}\right)} \tag{1}$$

For a threshold ratio $\gamma$ of 7.18, corresponding to a FAR of 1 count per day with a 1 MHz bandwidth, a 10 percent decrease in $\gamma$ corresponds to more than a hundredfold increase in the FAR, to 107 per day. Such a shift could easily result from a gradual increase of laser power or a power supply voltage shift in a particular detection system, for example.

There are several ways of fixing this problem. The simplest method, which is to estimate the total drift which is likely to occur, and then raise the threshold high enough that the FAR cannot get too large under any plausible condition, involves sacrificing sensitivity, or, often, paying a large financial penalty to achieve a bigger signal (e.g. buying a more powerful laser).

One somewhat better way is to detect the RMS voltage of the signal, and make the threshold voltage a constant multiple of the RMS value. However, there is no easy way of preventing the desired signals from perturbing the threshold in this case, which will lead to reduced sensitivity and a time-variable detection probability for small events.

U.S. Pat. No. 4,036,057 to Morais appears to teach a type of RMS signal level tracking. Morais adds the "peak" noise level to a fixed threshold in order to keep the threshold some pre-defined amount above the "peak noise level".

In the case of shot noise, where the noise voltage is related to the DC voltage in a simple way, the threshold could be derived from the DC value of the signal. Once again, this suffers from the perturbation of the threshold by the signal, and may be impractical in the presence of large low-frequency noise (as is often the case).

DISCLOSURE OF THE INVENTION

The present invention is directed to a system and method for detecting information signals by automatically thresholding input signals in the presence of noise of accurately known statistics concerning a predetermined acceptable false alarm rate data.

A first means is used for setting and adjusting a threshold value signal based on the input signal and the statistics concerning a predetermined acceptable false alarm rate. The first means includes: a comparator for comparing the input signal to an adjusted threshold signal and outputting a second false alarm rate; a feedback means having a predetermined bandwidth for determining the frequency of the second false alarm rate and adjusting the threshold value level based on the predetermined acceptable false alarm rate; and a means for setting the adjusted threshold signal to cause the second false alarm rate to be substantially larger that the first false alarm rate, and in a known mathematical relationship to the first false alarm rate.

A second comparator is used for comparing the threshold value signal to the input signal, and outputting a signal corresponding to the difference between the threshold value and the input signal.

A frequency-to-current converter is used for converting the frequency of the false alarm rate to a current signal. In addition, a servo amplifier is employed for generating an output corresponding to the threshold value signal, based on a difference between the current signal and a predetermined current.

The foregoing and other objects, features and advantages of the present invention will be apparent from the following more particular description of preferred embodiments of the invention, as illustrated in the accompanying drawings.

BRIEF DESCRIPTION OF THE DRAWINGS

The invention will be better understood if reference is made to the accompanying drawings in which.

BEST MODE FOR CARRYING OUT THE INVENTION

Figure 1:
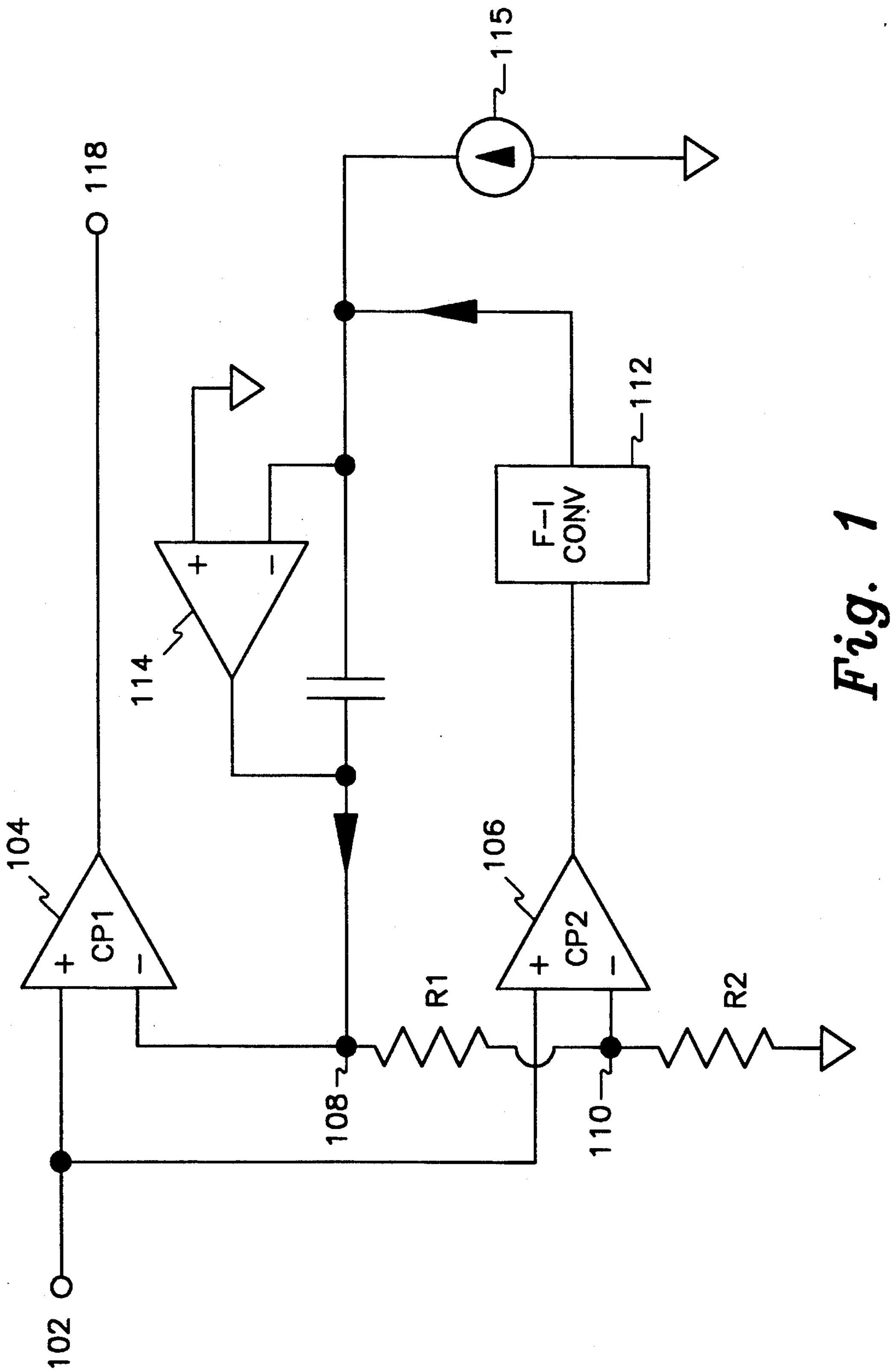
FIG. 1 shows a block diagram of a system in connection with the present invention.

A better way of achieving a constant, acceptable FAR in the presence of both signal events and a varying noise power, is shown conceptually in the block diagram at FIG. 1. The present invention capitalizes on the accurately known relationship between gamma and the FAR. Since the frequency of the threshold crossings (i.e., the false alarm rate), depends on the threshold, by controlling the threshold, one can control the frequency of the threshold crossings.

The signal to be thresholded comes in at an input node 102. It is presented to two comparators CP1 and CP2 (shown at 104 and 106, respectively), whose other inputs are fed as references $V_t$ and $aV_t$ (shown at 108 and 110, respectively), where a is set by the voltage divider R1/R2 to:

$$a = \frac{R2}{R1 + R2} \quad (2)$$

The value of a is chosen to keep the false alarm rate FAR1 of the comparator CP1 at the desired value. The false alarm rate FAR1 is the system output shown at 118. The false alarm rate FAR2 of the comparator CP2 is considerably greater than the expected maximum rate λ (lambda) of true count events so the frequency of threshold crossings at CP2 is a good estimate of FAR2, even in the presence of the signal. The randomly spaced pulses from the comparator CP2 are converted to a current by a frequency-to-current (F-I) converter shown generally at 112. The current feeds a servo system, represented in FIG. 1 by a differential amplifier 114 and a constant current source 115.

During operation, if the noise voltage at the input 102 increases slightly, both the false alarm rates FAR1 and FAR2 increase, with the fractional increase of FAR1 being somewhat greater. The increase in FAR2 causes the output of differential amplifier 114 to slew (because the current from the frequency-to-current converter 112 is increasing compared to the current supplied by the constant current supply 115) and thereby change $V_t$ at node 108, until FAR2 decreases to the nominal value once again. The bandwidth of the servo system is determined by the differential amplifier 114 and the total servo system gain.

True signal counts do not contribute significantly to the input frequency seen by the frequency-to-current converter 112, because FAR2 is chosen to be large compared to the largest expected value of λ. Thus, the threshold is not disturbed by the presence of true count signals.

If a further check is desired, one or more additional comparators could be included, with their reference voltages derived from additional taps on the voltage divider R1/R2. Comparing their false alarm rates with the calculated (or previously measured) values would be a sensitive way to detect any deviation from the expected noise statistics, which might be due to a malfunction or to an interfering signal.

Figure 2:
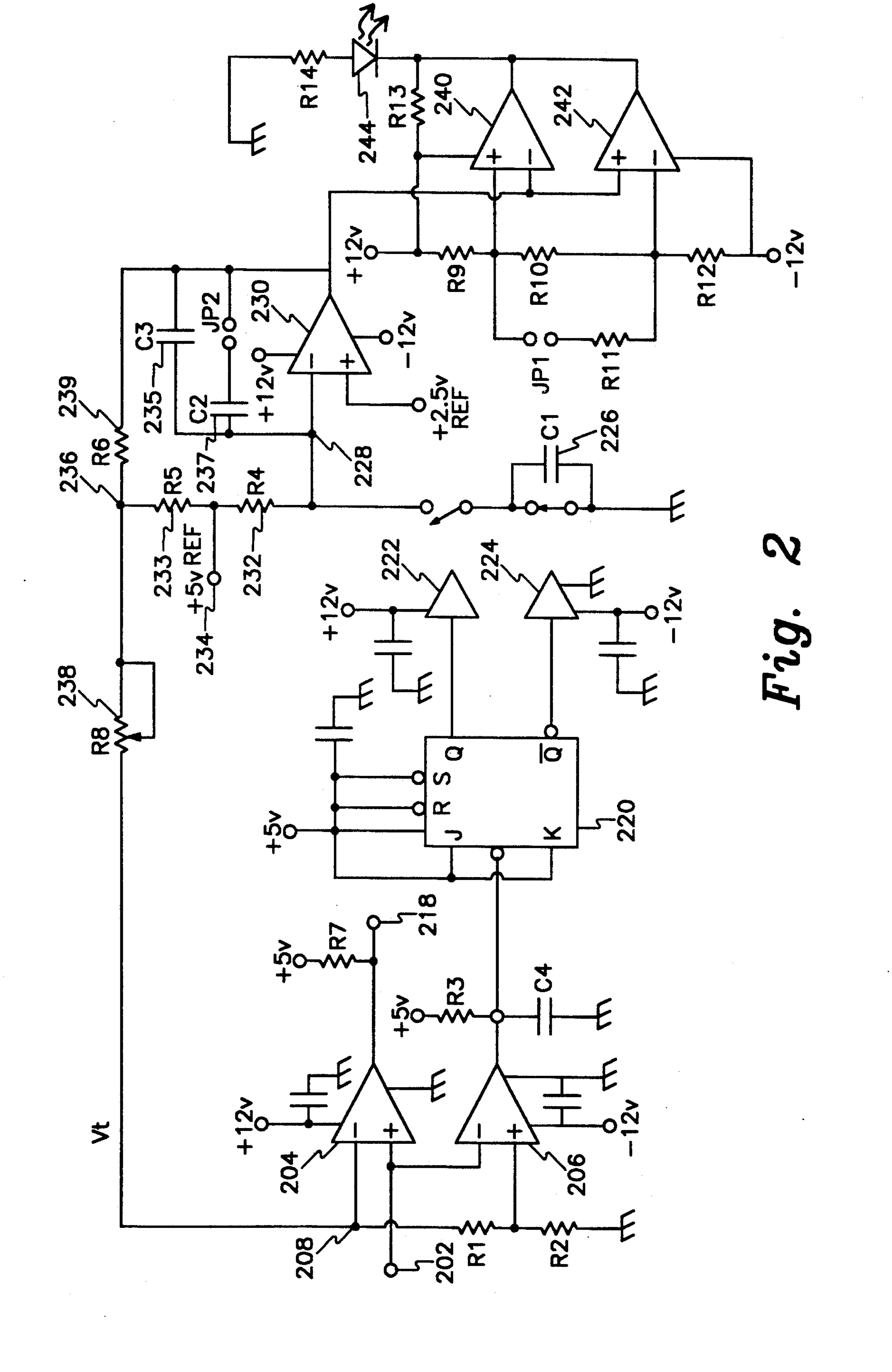
FIG. 2 shows an example embodiment of a circuit in connection with the present invention.

A preferred embodiment in connection with the present invention is shown in FIG. 2. In the circuit shown in FIG. 2, the input shown at 202 has a bandwidth of about 300 kHz, and the nominal values of FAR2 and FAR1 (output 218) are 5 kHz and 1 Hz, respectively.

The two comparators CP1 and CP2 are shown at 204 and 206, respectively. The voltage dividing resistors R1 and R2 are also shown in FIG. 2.

In this embodiment the F-I converter 112 is a charge pump type, comprising a JK flip-flop 220, an pair of analog switches 222 and 224 and a switching capacitor 226.

Both inputs of the JK flip-flop 220 are connected to the supply voltage to force the flipflop to function as a divide-by-two counter. On every clock pulse, i.e., every positive-going threshold crossing at comparator 206, Q and $\overline{Q}$, which are always opposite in value, change state (i.e., they change from 10 to 01 to 10 to 01 to 10).

The flip-flop 220 switches back and forth between states to drive a charge pump composed of two analog switches 222 and 224 and pump capacitor 226. Thus, one, but never both, of the analog switches 222 and 224 is always closed. Pump capacitor 226 is preferably a polystyrene capacitor. Polystyrene is a good dielectric because its dielectric absorption is low. This makes a linear, time invariant charge pump.

Operationally, the combination of the flipflop 220 and the analog switches 222,224 alternately connect the pump capacitor 226 to a summing junction 228 and to ground. The node 228 is maintained at 2.5 V by the negative feedback created by the servo system and the fact that the non-inverting input of an integrating servo amplifier 230 is connected to a 2.5 V reference voltage. The charge in the pump capacitor 226 is then dumped to ground when the output of the analog switches 222 and 224 switch states according to the Q and $\overline{Q}$ outputs of the flipflop.

The summing junction 228 is the inverting input of the integrating servo amplifier 230.

If the flip-flop 220 is initially in the set condition (as shown in FIG. 2), the capacitor 226 is connected to ground. During the period when the comparator 206 remains quiescent, the resistor 232 sources a current of 2.5 V/267 kΩ or 9.4 μA into the summing junction 228, causing the output of the servo amplifier 230 to ramp downward at a rate of 9.4 μA/0.11 μF or 85 V per second. When the next positive-going threshold crossing at the comparator 206 occurs, the flip-flop changes state and the capacitor is connected to the summing junction 228. Since feedback is holding point 228 at 2.5 volts, the capacitor 226 charges up to that voltage, which removes a charge of 2.5 V times 1500 pF or 3750 pC from the summing junction. The charge comes from the feedback capacitors 235 and 237, causing the output voltage of the amplifier 230 to increase abruptly by 3750 pC/0.11 μF, or 34 mV. The next positive-going threshold crossing at the comparator 206 discharges the capacitor 226 by connecting it to ground, returning the charge pump to its initial state. This cycle repeats with every two positive-going threshold crossings, so that on a time-averaged basis, the charge pump shunts to ground a current of 3750 pC times its switching frequency (which is FAR2/2). It thus functions as a frequency-to-current converter.

The two processes competing to change the output voltage of the amplifier 230, namely steady ramping down due to the reference current through the resistor 232 and stochastic jumping up due to the action of the charge pump, act in opposite directions. The ramping down reduces the threshold voltage, so increasing the value of FAR2 and hence the switching frequency of the charge pump, while the charge pump increases the threshold voltage, decreasing its own switching rate (and hence the rate at which it removes charge) in the process. A stable, although somewhat noisy, balance is achieved when the reference current equals the average charge-pump current, which in this case means that the average charge pumping frequency is (9.4 μA)/3750 pC, or 2500 Hz, and hence FAR2 is 5 kHz.

The reference current flowing through resistor 232 thus sets the equilibrium value of FAR2 by causing the feedback to adjust the threshold voltage on the comparator 206 until the average switching frequency FAR2/2 of the charge pump is just sufficient for the charge pump to remove the reference current.

The switched capacitor running into a fixed voltage drop is therefore equivalent to a frequency-to-current converter. The servo amplifier 230 simply moves this output around in response to its input and the servo system will come to a steady state when the average current being drawn out by the frequency-to-current converter (the JK flip-flop 220, the analog switches 222 and 224 and the switching capacitor 226) is equal to the DC current which is flowing through the resistor 232.

The servo amplifier 230 is preferably an op-amp, and does not draw any current on its own (at least not of any consequence). Thus, any remaining current flowing into the summing junction charges the feedback capacitor 235. (The jumper JP2 is normally shorted. Therefore the capacitor 237 is charged during normal operation. The function of the jumper JP2 will be discussed further below in connection with the window comparator circuit.)

In normal operation, the output of the amplifier 230 is divided by 11 (eleven) and simultaneously summed with the 5 V reference by a voltage divider formed between a pair resistors 233 and 239, resulting in a combined output at node 236 which can swing from about 3.56 to 5.54 volts. The resulting voltage at node 236 is the basic threshold voltage.

It is desirable to restrict the change of the threshold voltage in order to ensure that large departures from nominal performance cause an alarm condition. A potentiometer 238 is therefore provided for adjusting the attenuation of the combined output voltage at the node 236 so that, when the servo system is operating nominally, the output voltage of the amplifier 230 is near the middle of its (output swing) range. Hence, the potentiometer 238 is used for setting the center of the threshold voltage range.

The value of resistor 233 is small compared to the value of resistor 239, that means that the voltage at the node 236 is largely determined by the reference voltage 234. The output only moves the reference voltage by ±20%. That means that the threshold voltage in this particular embodiment varies about ±20%.

The attenuation adjustment is aided by the circuitry shown in the lower right hand corner of FIG. 2, consisting of a window comparator including two comparators 240 and 242, and a red/green light emitting diode (LED) 244. The LED 244 is connected to glow green when the system is operating normally and glow red when the output of the amplifier 230 is in or near saturation.

In normal operation, a jumper JP1 is open and a second jumper JP2 is shorted. In this condition, the servo system bandwidth constant is set by the product of the various gains in the system divided by the product R4.(C2+C3), and the alarm limits on the output voltage of the amplifier 230 are about ±8.6 V.

In test mode, jumper JP1 is shorted, and jumper JP2 is opened; this increases the servo system bandwidth by a factor of 11 (to reduce the waiting time during testing), and reduces the alarm limits (i.e., when the LED's color changes from green to red) to ±0.43 V. When the potentiometer 238 is adjusted so that the LED turns green, the system is properly set up. After this adjustment, jumper JP1 is opened and jumper JP2 is shorted once more.

The threshold voltage at 208 is fed to the comparator 204 where it is compared to the noisy signal for the system input 202. The automatically thresholded output is shown at 218 of FIG. 2, and corresponds to FAR1 discussed above in connection with FIG. 1.

The threshold voltage at 208 also is fed into the voltage divider formed of resistors R1 and R2 as discussed previously. Comparator 206 compares the adjusted threshold voltage ($aV_t$) to the noisy signal for the system input 202. The output of the comparator 206 corresponds to FAR2 discussed above in connection with FIG. 1, and is fed to the flipflop 220.

With the servo system operating, and assuming the noise statistics do not change drastically, the false alarm rate at the system's output 218 is held at 1 per second as the input RMS noise voltage changes by as much as ±20 percent. Such a swing would cause a fifteen thousand-fold change in the false alarm rate of a system with a fixed threshold at the same nominal FAR.

All of the elements shown in FIG. 2 are currently commercially available. Representative parts and corresponding manufacturer model numbers for some of the ICs elements of FIG. 2 are listed below in Table 1. Many functional and operational equivalents of these elements and/or their block representations in FIG. 1, will become evident to those of ordinary skill in the art.

TABLE 1

| ELEMENT | EXAMPLE |
|---|---|
| 204,206 | LT319N Linear Technology Corp. |
| 220 | 74HC112 Texas Instruments Inc. |
| 222,224 | DG308A Siliconix Incorporated |
| 230 | TL074 Texas Instruments Inc. |
| 240,242 | LM339 National Semiconductor |

The present invention can be applied to thresholding in any system in which the noise statistics are known and the events being monitored or counted are relatively infrequent compared to the bandwidth.

While various embodiments of the present invention have been described above, it should be understood that they have been presented by way of example, and not limitation. Thus the breadth and scope of the present invention should not be limited by any of the above-described exemplary embodiments, but should be defined only in accordance with the following claims and their equivalents. It will be understood by those skilled in the art that various changes in form and detail may be made therein without departing from the spirit and scope of the invention.

What is claimed is:

1. A method for detecting information signals by automatically thresholding input signals in the presence of noise of accurately known statistics concerning a predetermined acceptable false alarm rate data, comprising the steps of:

setting a first threshold value signal based on the input signal and the statistics concerning the predetermined acceptable false alarm rate;

comparing the input signal to a second threshold signal related to the first, and outputting a second false alarm rate;

determining the frequency of said second false alarm rate;

adjusting said first threshold value signal based on the predetermined acceptable false alarm rate and said frequency of said second false alarm rate;

setting said second threshold signal to cause said second false alarm rate to be substantially larger that said first false alarm rate;

converting the frequency of said predetermined acceptable false alarm rate to a current signal using a frequency-to-current converter means; and generating an output corresponding to said adjusted first threshold value signal, based on a difference between said current signal and a predetermined current using a servo amplifier means.

2. A method according to claim 1, further comprising a step of monitoring said servo amplifier and signaling when said output of said servo amplifier is within a predetermined saturation window using a window comparator means.

3. A system for automatically thresholding an input signal in the presence of gaussian noise to detect actual input signal events, comprising:

(a) a first comparator having a first input for receiving the input signal and a second input for receiving a first reference signal having a threshold value level, said first comparator outputting a first threshold crossing rate representing the actual input signal events and having a first false alarm rate, said first threshold crossing rate being the difference between the input signal and said threshold value level;

(b) a second comparator having a first input for receiving the input signal and a second input for receiving a second reference signal, said second comparator outputting a second threshold crossing rate having a second false alarm rate, said second threshold crossing rate being the difference between the input signal and said second reference signal; and (c) feedback means for generating said first and second reference signals, said second reference signal begin a function of said threshold value level, said feedback means comprising:

(1) a frequency-to-current converter means for converting the frequency of said second threshold crossing rate to a current signal, said frequency-to-current converter comprising:

(i) a frequency divider to generate a signal corresponding to a fixed fraction of said second threshold-crossing rate, and (ii) a charge pump connected to said frequency divider to alternately connect a pump capacitor from a reference ground potential to a node to thereby generate said current signal at said node;

(2) servo amplifier means coupled to said node, for generating said threshold value level based on a difference between said current signal and a predetermined current; and (3) further means, coupled to said servo amplifier means, for generating said second reference signal based on said threshold value level.

4. A system according to claim 3, further comprising a window comparator means for monitoring said servo amplifier output and signalling when said output is within a predetermined saturation window.

5. The system according to claim 3, wherein said further means comprises a voltage divider.

6. The system according to claim 3, wherein said frequency divider comprises a flipflop having Q and $\overline{Q}$ outputs, signal inputs coupled to a logic high potential and a clock input coupled to said second threshold crossing rate output of said second comparator to force the flipflop to function as a divide-by-two counter.

7. The system according to claim 6, wherein said charge pump comprises first and second analog switches having inputs connected to said Q and $\overline{Q}$ outputs of said flipflop, respectively, to alternately connect said pump capacitor from said reference ground potential to said node.

8. A method for automatically thresholding an input signal in the presence of gaussian noise to detect actual input signal events, comprising the steps of:

(a) comparing the input signal and a first reference signal having a threshold value level, and outputting a first threshold crossing rate representing the actual input signal events and having a first false alarm rate, said first threshold crossing rate being the difference between the input signal and said threshold value level;

(b) comparing the input signal and a second reference signal, and outputting a second threshold crossing rate having a second false alarm rate, said second threshold crossing rate being the difference between the input signal and said second reference signal; and (c) generating said first and second reference signals, said second reference signal being a function of said threshold value level, by:

(1) converting the frequency of said second threshold crossing rate to a current signal by:

(i) generating a signal corresponding to a fixed fraction of said second threshold-crossing rate, and (ii) alternately connecting, at the rate of said signal generated in step (i), a pump capacitor from a reference ground potential to a node to thereby generate said current signal at said node, and (2) generating said threshold value level based on a difference between said current signal and a predetermined current.

9. The method according to claim 8, further comprising a step of voltage dividing said first reference signal to generate said second reference signal and thereby cause said second false alarm rate to be greater than said first false alarm rate.

10. The method according to claim 8, further comprising the steps of coupling signal inputs of a flipflop to a logic high potential and applying said second threshold crossing rate output of said second comparator to a clock input of the flipflop to force the flipflop to function as a divide-by-two counter.

* * * * *